(12) United States Patent
Lee

(10) Patent No.: US 7,466,621 B2
(45) Date of Patent: Dec. 16, 2008

(54) ROW ADDRESS CONTROLLER

(75) Inventor: Jeong Woo Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 134 days.

(21) Appl. No.: 11/683,609

(22) Filed: Mar. 8, 2007

(65) Prior Publication Data

US 2008/0002507 A1    Jan. 3, 2008

(30) Foreign Application Priority Data

Jun. 30, 2006    (KR) ...................... 10-2006-0061546

(51) Int. Cl.
*G11C 8/00* (2006.01)
(52) U.S. Cl. .............................. 365/230.06; 365/230.03
(58) Field of Classification Search ............ 365/230.06, 365/230.03, 230.08
See application file for complete search history.

(56) References Cited

U.S. PATENT DOCUMENTS 6,269,046 B1 * 7/2001 Lee et al. ............... 365/230.06

6,304,989 B1 * 10/2001 Kraus et al. ................. 714/733
7,397,715 B2 * 7/2008 Lim et al. .................... 365/201

FOREIGN PATENT DOCUMENTS

| KR | 100192573   | 1/1999  |
|----|-------------|---------|
| KR | 100224681   | 7/1999  |
| KR | 19990086099 | 12/1999 |
| KR | 1020010109572 | 12/2001 |

* cited by examiner

*Primary Examiner*—Anh Phung
(74) *Attorney, Agent, or Firm*—Ladas & Parry LLP

(57) ABSTRACT

Disclosed is a row address controller comprising: a bank control unit generating an active pulse and a precharge pulse, a word line clear signal and a block selection enable signal using the active pulse and precharge pulse. An address decoder latches and decodes a row address signal in response to a decoder enable signal and outputs a first and second address signals. A block selection unit generates a block selection signal in response to a redundancy signal, a repair signal, the word line clear signal, the block selection signal and the first address signal. A block control unit generates a word line latch signal in response to the precharge pulse and block selection signal A latch unit latches and outputs the second address signal in response to the word line latch signal.

27 Claims, 8 Drawing Sheets

ROW ADDRESS CONTROLLER

CROSS-REFERENCE TO RELATED APPLICATIONS

The present application claims priority to Korean patent application number 10-2006-0061546 filed on Jun. 30, 2006, which is incorporated herein by reference in its entirety.

BACKGROUND OF THE INVENTION

The present invention relates to a semiconductor memory device, and more particularly to a row address controller.

As generally known in the art, a dynamic random access memory (DRAM), which is a semiconductor memory device, is a volatile memory device including a plurality of cells, each cell containing one transistor and one capacitor.

Recently, as DRAMs have been highly integrated, studies have been conducted to develop a DRAM using less current and having a higher efficiency by simplifying the control unit controlling the operation of the DRAM.

Meanwhile, a DRAM, which is a conventional semiconductor memory device, receives external commands "/RAS," "/CAS" and "/WE" input from an exterior source, and creates or generates internal command pulses. The internal command pulses enable the internal operation of the DRAM to be controlled at a proper time.

The DRAM, which is a conventional memory device, delays and uses a created internal command pulse in order to generate a different control signal required for the operation of the DRAM.

For example, the DRAM delays an active pulse created in the DRAM according to an external active command, and a precharge pulse created in the DRAM according to an external precharge command, and generates a control signal for a row address processing control. Such an operation of the DRAM will now be described with respect to the bank control unit of a conventional row address controller.

FIG. 1 is a block diagram illustrating the construction of the bank control unit 10 in a conventional row address controller. Referring to FIG. 1, the bank control unit 10 of the conventional row address controller receives an active pulse "ACT13," and generates an ACT14 pulse, an ACT16 pulse and an ACT22 pulse, through a plurality of delay units. In addition, the bank control unit receives a precharge pulse "PCG12," and generates a PCG15 pulse, a PCG19 pulse and a PCG21 pulse, through a plurality of delay units.

The plurality of delay units requires many transistors, thereby degrading the efficiency of a memory cell. Also, the pulses generated through such a delay cause toggle of an address signal, thereby causing unnecessary current consumption in a row address decoder.

The problem of a conventional row address controller will now be described in more detail.

FIG. 2 is a block diagram illustrating the construction of a conventional row address controller 20, and FIG. 3 is a timing view illustrating the operation of the row address controller shown 20 in FIG. 2. Referring to FIGS. 2 and 3, the bank control unit receives an active pulse "ACT13" and a precharge pulse "PCG13," and generates and outputs an ACT16 pulse, a PCG19 pulse, a word line clear signal "WLCB" and a block selection enable signal "BSENB." An address enable signal generating unit receives the ACT16 pulse and PCG19 pulse, and generates and outputs address enable signals "BXADDENB" and "BXADDEN_COM."

The bank control unit and address enable signal generating unit use a plurality of delay units in order to generate these signals, that is, the ACT16 pulse, the PCG19 pulse, the word line clear signal "WLCB," the block selection enable signal "BSENB" and the address enable signals "BXADDENB" and "BXADDEN_COM." Therefore, the area occupied by the delay units increases within an X cross region in which the bank control unit and address enable signal generating unit are located.

The signals generated by the bank control unit and address enable signal generating unit are input to different blocks, such as a block selection unit, first and second latch units, and a word line enable control unit, which are located in an X hole region, for a row address processing control, and are used to generate control signals for a sub-word line driver, a main word line driver and a redundancy word line driver.

A row address decoder receives the address enable signal "BXADDEN_COM," and outputs signal "BAX34,56,78" and signal "BAX9AB" to first and second latch units, respectively. The signals "BAX34, 56, 78" and "BAX9AM" are obtained by decoding row address GAX<0:11>, The first latch unit receives the address enable signal "BXADDENB," and latches and outputs the signal "BAX34,56,78" to the main word line driver. The second latch unit latches and outputs the signal "BAX012" to the sub-word line driver.

Address "LAX34,56,78" and address "LAX012," which are latched by the first and second latch units, are logically operated with a block selection signal "BSB" of the block selection unit, a word off signal "LXDPB" of a delay unit and output signals "MWLEN" and "RMWLEN" of the word line enable control unit, in the sub-word line driver, main word line driver and redundancy word line driver, thereby enabling a sub-word line, a main word line and a redundancy word line.

In the conventional row address controller, various related signals have insufficiently coherent relation, which may cause lack in the margin according to a skew of each signal, thereby causing failure. For example, the main word line driver performs a logic operation with respect to the word off signal "LXDPB" and main word line enable signal "MWLEN" during a time period in which signal "LAX34, 56,78" is latched by the first latch unit and is output as a valid signal, thereby generating a main word line driving signal "MWLB."

Herein, while the block selection signal "BSB" is related to both the generation of the word off signal "LXDPB" and the generation of the main word line enable signal "MWLEN," the block selection enable signal "BSENB" is related to only the generation of the main word line enable signal "MWLEN." Therefore, the main word line driving signal "MWLB" must secure a margin for the word off signal "LXDPB" and main word line enable signal "MWLEN," and must also take into consideration a margin for other signals relating to the word off signal "LXDPB" and main word line enable signal "MWLEN."

Meanwhile, the "BAX34,56,78" is generated through a logic operation with respect to the row address GAX<0:11> and the address enable signal "BXADDEN_COM" in the address decoder, and has a valid address value only in a period in which the address enable signal "BXADDENB" is enabled. Therefore, the "BAX34,56,78" generates toggle of an address signal in the same phase shape as that of the address enable signal "BXADDENB." The address toggle of the "BAX34,56,78" serves as a cause of current consumption in the row address decoder. "BAX34<0>" and "BAX34<1>" in the timing view illustrate a case in which the toggle of an address signal is caused.

SUMMARY OF THE INVENTION

In order to overcome shortcomings of the prior art, there is provided a row address controller comprising: a bank control unit for generating an active pulse and a precharge pulse in response to an active precharge signal, and for generating a word line clear signal and a block selection enable signal by using the active pulse and precharge pulse; an address decoder for latching and decoding a row address signal in response to a decoder enable signal, and for outputting the decoded signal as a first address signal and a second address signal; a block selection unit for generating a block selection signal in response to a redundancy signal, a repair signal, the word line clear signal, the block selection signal and the first address signal; a block control unit for generating a word line latch signal in response to the precharge pulse and the block selection signal; and a latch unit for latching and outputting the second address signal in response to the word line latch signal.

Herein, the active precharge signal includes information about a time point when an active command is input, information about a bank to be activated, and information about a time point when a precharge command is input.

Preferably, the active pulse includes the information about a bank to be activated, and includes the information about the input time point of the active command at an edge of the active pulse, at which a level state is shifted.

Preferably, the precharge pulse includes the information about the input time point of the precharge command at an edge of the precharge pulse, at which a level state is shifted.

Preferably, the bank control unit generates a signal enabled from the input time point of the active command to the input time point of the precharge command, and outputs the generated signal as the word line clear signal.

Preferably, the bank control unit delays and outputs the active pulse as the block selection enable signal.

Preferably, the decoder enable signal is enabled when one of multiple banks is activated.

Preferably, the address decoder comprises: a transmission means for transmitting the row address signal in response to the decoder enable signal; a latch for latching and outputting an output signal of the transmission means; an inverter for inverting a phase of the output signal of the transmission means and for outputting the inverted signal; and a decoding unit for decoding an output signal of the latch and an output signal of the inverter.

Preferably, the transmission means comprises a transfer gate, which selectively transfers the row address signal in response to the decoder enable signal.

Preferably, the latch comprises two inverters connected to each other in such a manner that an input terminal of each inverter is connected to an output terminal of a counterpart inverter.

Preferably, the decoding unit comprises: a NAND gate for performing a NAND operation on the output signal of the latch and the output signal of the inverter; and an inverter for inverting a phase of an output signal of the NAND gate and for outputting the inverted signal.

Preferably, the row address signal includes a sub-word line address signal, a main word line address signal and a block address signal.

Preferably, the first address signal corresponds to the block address signal, and the second address signal includes the main word line address signal and the sub-word line address signal.

Preferably, the block selection signal includes a first block selection signal and a second block selection signal, and the block selection unit comprises: a block selection signal generator for generating the first block selection signal in response to the word line clear signal, the block selection enable signal, the first address signal, the redundancy signal and the repair signal; and a redundancy block selection signal generator for generating the second block selection signal in response to the word line clear signal, the block selection enable signal and the redundancy signal.

Preferably, the block selection signal generator comprises: a first transistor which is turned on in response to the word line clear signal, and outputs a power supply voltage through an output terminal of the first transistor; a second transistor which is connected to the output terminal of the first transistor and is turned on in response to the block selection enable signal; a third transistor which is connected to the second transistor and is turned on in response to the repair signal; a fourth transistor which is connected to the third transistor and is turned on in response to the first address signal so as to be connected to a ground voltage; and a fifth transistor which is connected to the second transistor and is turned on in response to the redundancy signal so as to be connected to a ground voltage.

Preferably, the block selection signal generator further comprises: a first latch module which is connected to the output terminal of the first transistor, and latches and outputs an output signal of the first transistor; and an inverter for inverting a phase of an output signal of the first latch module and for outputting the inverted signal.

Preferably, the redundancy block selection signal generator comprises: a sixth transistor which is turned on in response to the word line clear signal, and outputs a power supply voltage through an output terminal of the sixth transistor; a seventh transistor which is connected to the output terminal of the sixth transistor and is turned on in response to the block selection enable signal; and an eighth transistor which is connected to the seventh transistor and is turned on in response to the redundancy signal so as to be connected to a ground voltage.

Preferably, the redundancy block selection signal generator further comprises a second latch module connected to the output terminal of the sixth transistor, in which second latch module latches and outputs an output signal of the sixth transistor.

Preferably, the block control unit comprises: a word line off signal generator for generating a word line off signal, which is enabled when the precharge pulse and the first block selection signal are enabled; a latch pulse generator for generating a first word line latch pulse, a second word line latch pulse and a third word line latch pulse in response to the first and second block selection signals; and a redundancy enable signal generator for generating a redundancy word line latch pulse by delaying the second block selection signal.

Preferably, the word line off signal generator comprises: a first NAND gate for performing a NAND operation on the precharge pulse and a phase-inverted signal of the first block selection signal; and an inverter for inverting a phase of an output signal of the first NAND gate, and for outputting the inverted signal as the word line off signal.

Preferably, the latch pulse generator comprises: a first word line latch pulse generator for delaying an edge of the second block selection signal, inverting a phase of the second block selection signal, and outputting a resultant signal as the first word line latch pulse; a second word line latch pulse generator for generating the second word line latch pulse, which is enabled when the first block selection signal is enabled and the second block selection signal is disabled; and a third word line latch pulse generator for the third word line latch pulse, which is enabled when the first and block selection signals are enabled.

Preferably, the first word line latch pulse generator comprises: a second inverter for inverting a phase of the second block selection signal; a delay unit for delaying an output signal of the second inverter, and then outputting the output signal of the second inverter; a second NAND gate for performing a NAND operation on the output signal of the second inverter and an output signal of the delay unit; and a third inverter for inverting a phase of an output signal of the second NAND gate, and for outputting the inverted signal as the first word line latch pulse.

Preferably, the second word line latch pulse generator comprises: a fourth inverter for inverting a phase of the second block selection signal; a third NAND gate for performing a NAND operation on the first word line latch pulse and an output signal of the fourth inverter; and a fifth inverter for inverting a phase of an output signal of the third NAND gate.

Preferably, the third word line latch pulse generator comprises: a fourth NAND gate for performing a NAND operation on the first word line latch pulse and the second block selection signal; and a sixth inverter for inverting a phase of an output signal of the fourth NAND gate.

Preferably, the redundancy enable signal generator comprises an even number of inverters for delaying the second block selection signal.

Preferably, the latch unit comprises: a first latch module for latching the main word line address signal using the first word line latch pulse until the word line off signal is enabled, and then outputting the main word line address signal; a second latch module for latching the sub-word line address signal using the second word line latch pulse, and then outputting the sub-word line address signal; and a redundancy word line enable module for latching the redundancy word line enable signal using the third word line latch pulse, and then outputting the redundancy word line enable signal.

Preferably, the row address controller further comprises: a main word line driver for outputting a main word line driving signal in response to an output signal of the first latch module and the word line off signal; a sub-word line driver for outputting a sub-word line driving signal in response to an output signal of the second latch module and the word line off signal; and a redundancy word line driver for outputting a redundancy word line driving signal in response to an output signal of the redundancy word line enable module and the word line off signal.

BRIEF DESCRIPTION OF THE DRAWINGS

The above and other objects, features and advantages of the present invention will be more apparent from the following detailed description taken in conjunction with the accompanying drawings, in which.

DESCRIPTION OF SPECIFIC EMBODIMENTS

Figure 1:
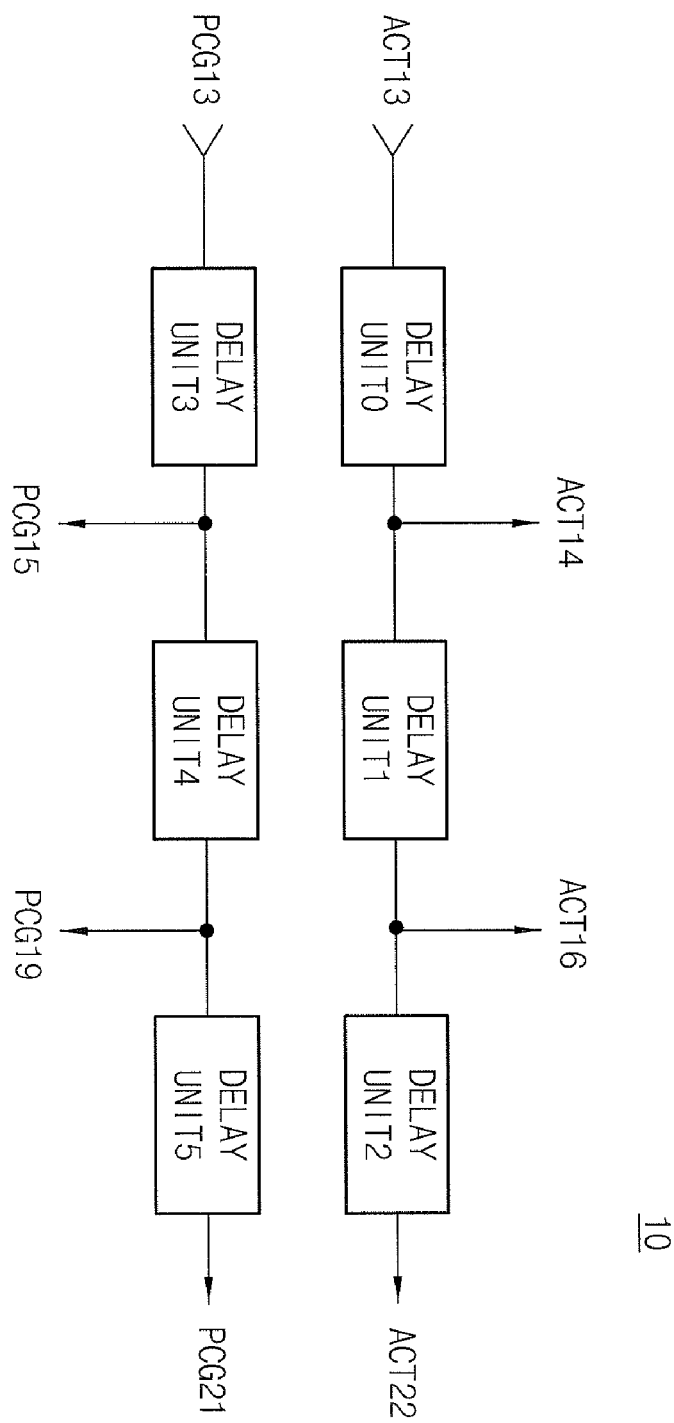
FIG. 1 is a block diagram illustrating the construction of a bank control unit in a conventional row address controller.
Figure 2:
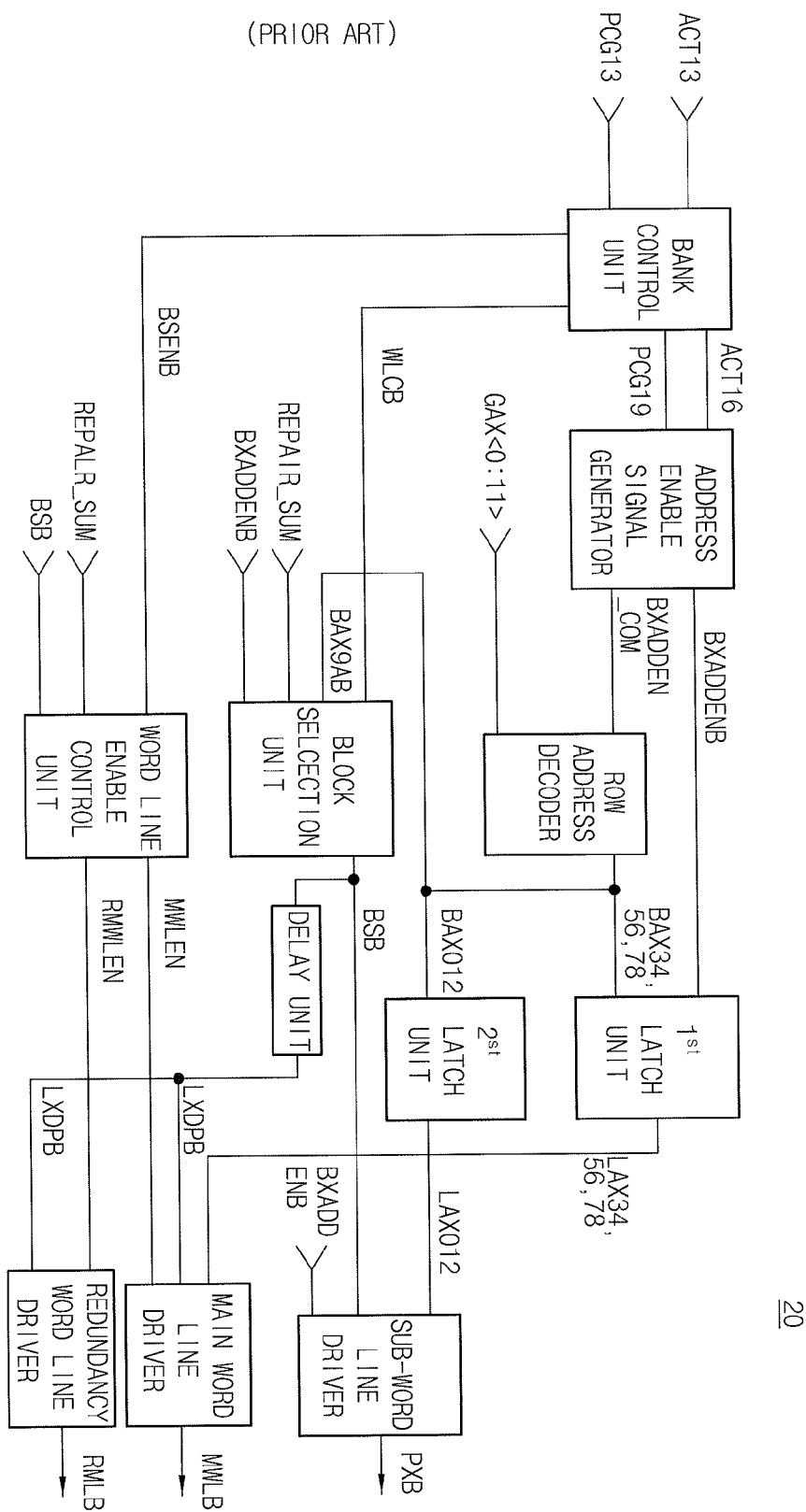
FIG. 2 is a block diagram illustrating the construction of a conventional row address controller.
Figure 3:
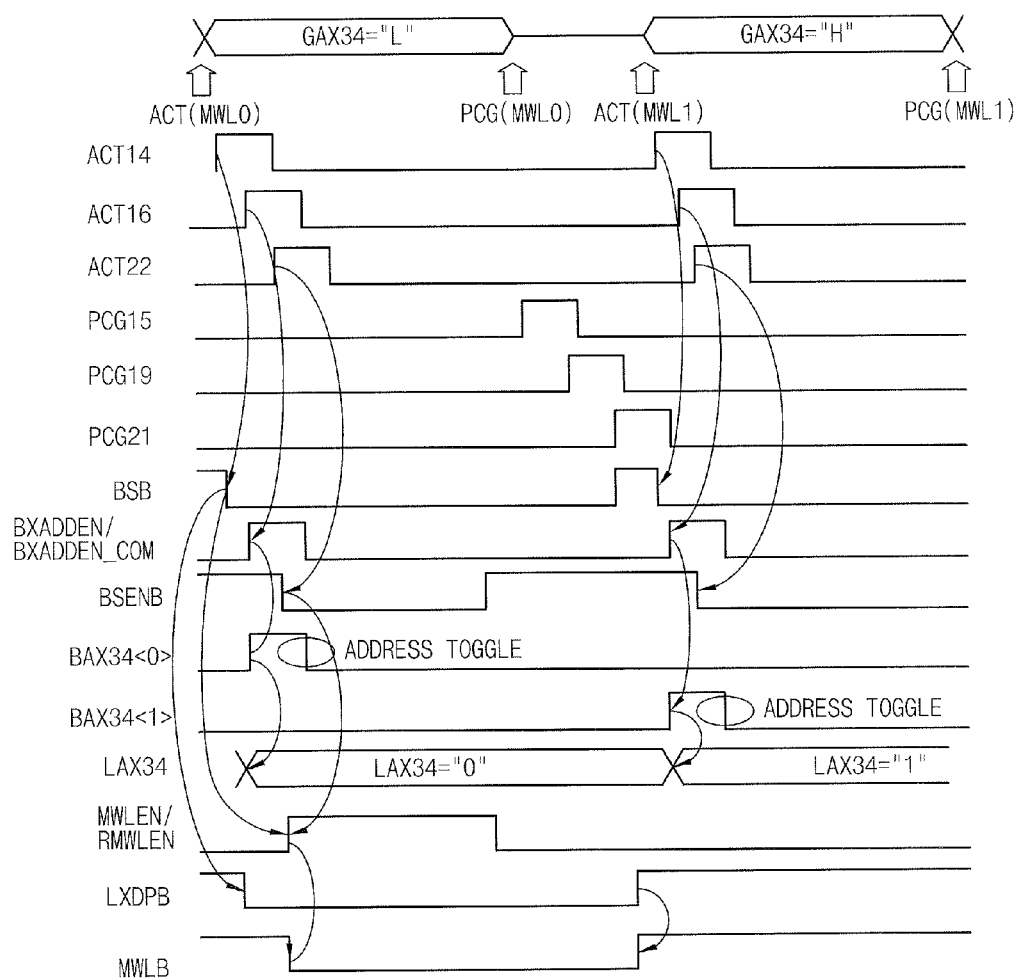
FIG. 3 is a timing view illustrating the operation of the row address controller of FIG. 2.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 4:
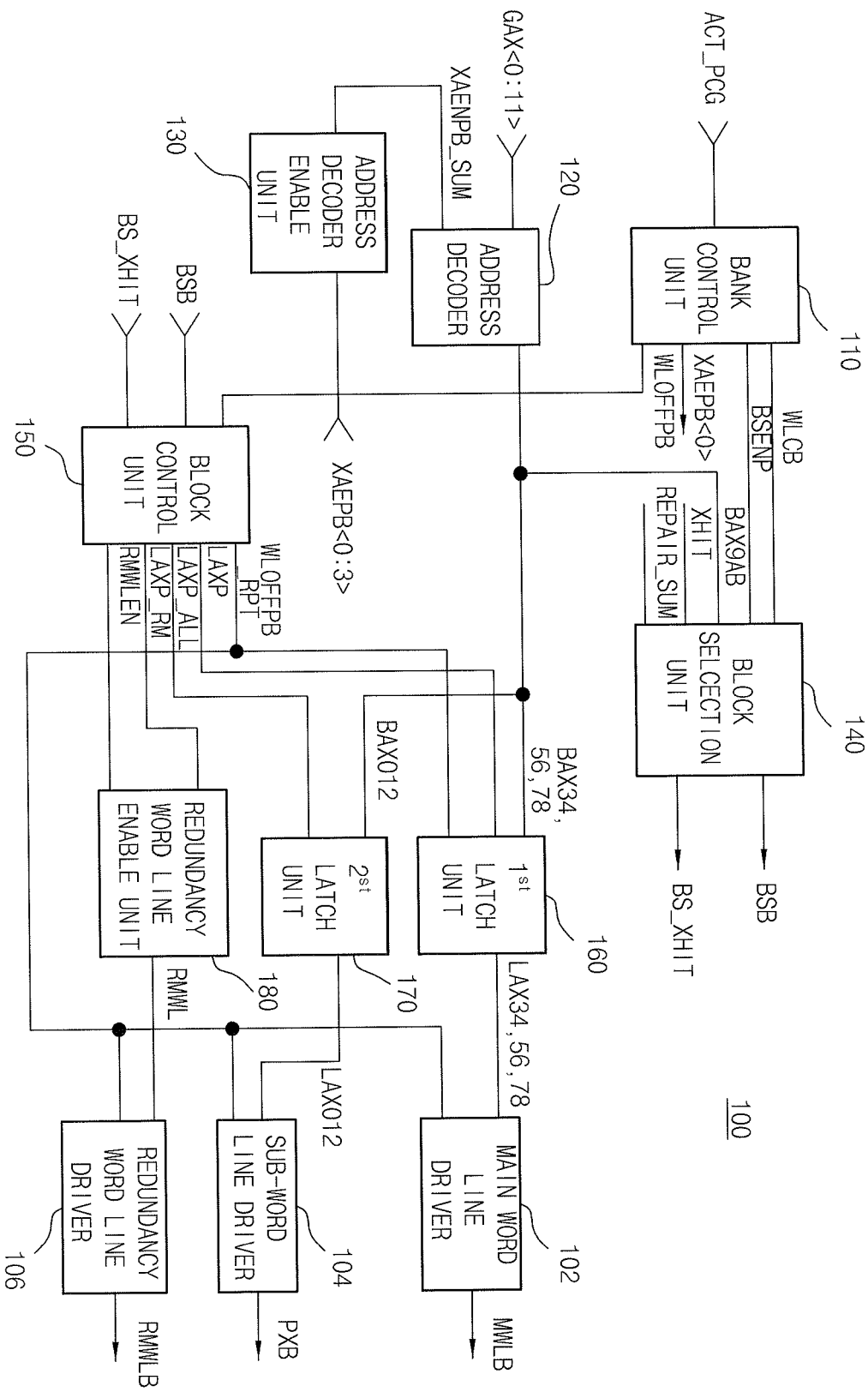
FIG. 4 is a block diagram illustrating the construction of a row address controller according to an embodiment of the present invention.

FIG. 4 is a block diagram illustrating the construction of a row address controller 100 according to an embodiment of the present invention. As shown in FIG. 4, a row address controller 100 according to an embodiment of the present invention receives an active precharge signal "ACT_PCG" and a row address GAX<0:11>, and controls word line drivers 102, 104 and 106. Herein, the word line drivers 102, 104 and 106 include a main word line driver 102, a sub-word line driver 104 and a redundancy word line driver 106.

In more detail, the row address controller 100 according to an embodiment of the present invention includes a bank control unit 110, an address decoder 120, an address decoder enable unit 130, a block selection unit 140, a block control unit 150, a first latch unit 160, a second latch unit 170 and a redundancy word line enable unit 180.

The bank control unit 110 receives an active precharge signal "ACT_PCG," and divides the active precharge signal "ACT_PCG" into an active pulse "XAEPB<0>" and a precharge pulse "WLOFFPB." Also, the bank control unit 110 generates a word line clear signal "WLCB" and a block selection enable signal "BSENP" by using the divided active pulse "XAEPB<0>" and precharge pulse "WLOFFPB." The active precharge signal "ACT_PCG" includes information about a time point when an active command is input and a time point when a precharge command is input.

Herein, the bank control unit 110 is illustrated with respect to a case of controlling bank "0" in a four-bank structure. Also, the active pulse "XAEPB<0>" has activated bank information, in which the "<0>" of "XAEPB<0>" represents that the active pulse "XAEPB<0>" is a signal of the bank "0."

The active pulse "XAEPB<0>" may be a low pulse enabled to a low state at a time point when an active command is input, and the precharge pulse "WLOFFPB" may be a low pulse enabled to a low state at a time point when a precharge command is input.

In this case, the word line clear signal "WLCB" corresponds to a pulse which rises at a falling edge of the active pulse "XAEPB<0>" and falls at a falling edge of the precharge pulse "WLOFFPB." That is, the word line clear signal "WLCB" is enabled to a high state from a time point when an active command is input to a time point when a precharge command is input. A block selection enable pulse "BSENP" refers to a signal to enable the block selection unit 140, and is a high pulse generated at a time point when the falling edge of the active pulse "XAEPB<0>" is delayed.

The address decoder 120 receives and decodes a decoder enable signal "XAENPB_SUM" and a row address signal GAX<0:11>, thereby outputting BAX012, BAX34,56,78 and BAX9AB. Herein, the decoder enable signal "XAENPB_SUM" refers to a signal to enable the address decoder 120, and is enabled when any one of the banks is activated.

That is, the address decoder 120 can latch and output a decoded row address by using the decoder enable signal "XAENPB_SUM," until the next active command is input.

Therefore, the address decoder 120 according to an embodiment of the present invention can solve the problem of unnecessary current consumption due to toggle of an address signal, which occurs in the prior art. The construction of the address decoder 120 will be described later in more detail with reference FIG. 5.

Meanwhile, the BAX012 refers to a decoded sub-word line address signal, the BAX34,56,78 refers to a decoded main word line address signal, and the BAX9AB refers to a decoded redundancy word line address signal.

The address decoder enable unit 130 receives an active pulse "XAEPB<0:3>," and generates the decoded enable signal "XAENPB_SUM." That is, the address decoder enable unit 130 enables and outputs the decoded enable signal "XAENPB_SUM" to the address decoder 120 when any one bank in the four-bank structure is activated.

The block selection unit 140 generates and outputs a block selection signal "BSB" and a redundancy block selection signal "BS_XHIT," in response to the word line clear signal "WLCB," the block selection enable signal "BSENP," a decoded block address signal "BAX9AB," a redundancy signal "XHIT" and a repair signal "REPAIR$_{13}$ SUM."

Herein, the redundancy signal "XHIT" includes redundancy information about whether a corresponding address bit is selected, and the repair signal "REPAIR_SUMB" refers to a signal to perform an AND operation on redundancy signals and includes repair information. The redundancy block selection signal "BS_XHIT" includes block selection information and redundancy information. The construction of the block selection unit 140 will be described later in more detail with reference to FIG. 6.

The block control unit 150 generates and outputs a word line off signal "WLOFFPB_RPT," a sub-word line latch pulse "LAXP_ALL," a main word line latch pulse "LAXP," a redundancy word line latch pulse "LAXP_RM" and a redundancy word line enable signal "RMWLEN" in response to the precharge pulse "WLOFFPB," the block selection signal "BSB" and the redundancy block selection signal "BS_X-HIT."

Herein, the word line off signal "WLOFFPB_RPT" includes word line off information. The sub-word line latch pulse "LAXP_ALL" is used to latch an address used in the sub-word line driver. The main word line latch pulse "LAXP" is used to latch an address used in the main word line driver. The redundancy word line latch pulse "LAXP_RM" latches the redundancy word line enable signal "RMWLEN." The construction of the block control unit 150 will be described later in more detail with reference to FIG. 7.

The first latch unit 160 receives the decoded main word line address signal "BAX34,56,78," the main word line latch pulse "LAXP" and the word line off signal "WLOFFPB_RPT," latches the decoded main word line address signal "BAX34,56,78" using the main word line latch pulse "LAXP" until the word line off signal "WLOFFPB_RPT" is enabled, and generates and outputs a latched main address signal "LAX34,56,78" to the main word line driver 102. Herein, the word line off signal "WLOFFPB_RPT" may be used to prevent an address-related signal from changing when a word line is turned off.

The second latch unit 170 receives the decoded sub-word line address signal "BAX012" and the sub-word line latch pulse "LAXP_ALL," latches the decoded sub-word line address signal "BAX012" using the sub-word line latch pulse "LAXP_ALL," and generates and outputs a latched sub-address signal "LAX012" to the sub-word line driver 104.

The redundancy word line enable unit 180 receives the redundancy word line latch pulse "LAXP_RM" and the redundancy word line enable signal "RMWLEN," and generates and outputs a redundancy main word line signal "RMWL" to the redundancy word line driver 106.

Figure 5:
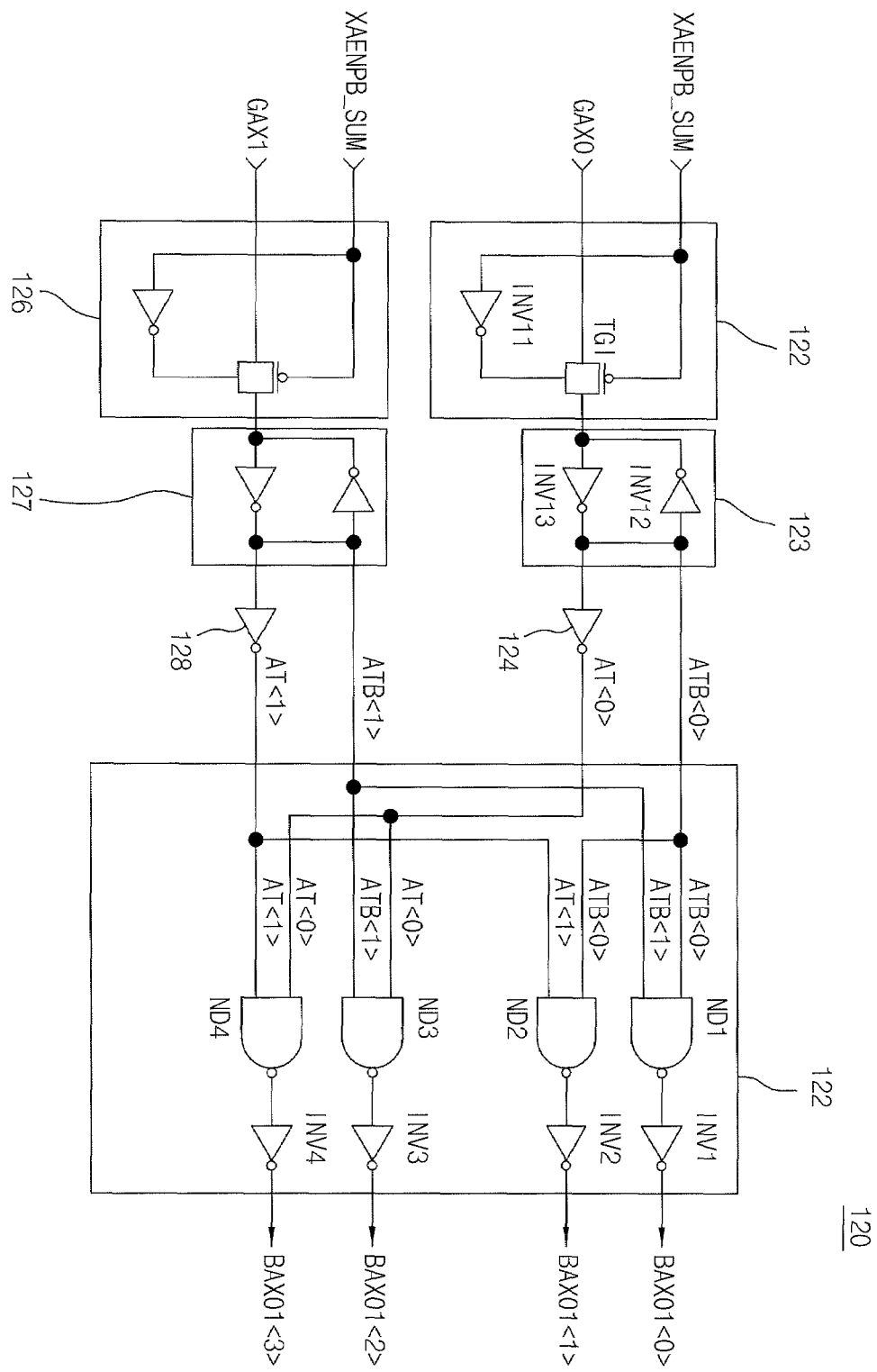
FIG. 5 is a circuit diagram illustrating the construction of the address decoder of FIG. 4.

FIG. 5 is a circuit diagram illustrating the construction of the address decoder of FIG. 4. As shown in FIG. 5, the address decoder according to an embodiment of the present invention is constructed to decode a two-bit address signal, and includes a first transmission means 122, a first latch 123, a first inverter 124, a second transmission means 126, a second latch 127, a second inverter 128 and a decoding unit 129.

The first transmission means 122 receives and transmits a first address bit "GAX0" to the first latch 123 in response to the decoder enable signal "XAENPB_SUM." In more detail, the first transmission means 122 includes a transfer gate TG1 for selectively transmitting the first address bit "GAX0" in response to the decoder enable signal "XAENPB_SUM," and an inverter INV1 for obtaining a phase-inverted signal of the decoder enable signal "XAENPB_SUM."

The first latch 123 latches and outputs a signal, which has been transmitted from the first transmission means 122, as a signal "ATB<0>." In more detail, the first latch 123 includes two inverters INV12 and INV13 connected to each other in such a manner that the input terminal of each inverter is connected to the output terminal of its counterpart inverter. The first inverter 124 inverts the phase of the output signal "ATB<0>" of the first latch 123, and outputs the inverted signal as a signal "AT<0>."

The second transmission means 126 receives and transmits a second address bit "GAX1" to the second latch 127 in response to the decoder enable signal "XAENPB_SUM." The second latch 127 latches and outputs a signal, which has been transmitted from the second transmission means 126, as a signal "ATB<1>." The second inverter 128 inverts the phase of the output signal "ATB<1>" of the second latch 127, and outputs the inverted signal as a signal "AT<1>." The second transmission means 126 and second latch 127 have the same constructions as the first transmission means 122 and first latch 123, so a detailed description thereof will be omitted.

The decoding unit 129 receives the output signals of the first latch 123, first inverter 124, second latch 127 and second inverter 128, and decodes the received signals to signals "BAX01<0:3>." In more detail, the decoding unit 129 includes NAND gate ND1 for performing the NAND operation on signals ATB<0> and ATB<1>, NAND gate ND2 for performing the NAND operation on signals ATB<0> and AT<1>, NAND gate ND3 for performing the NAND operation on signals AT<0> and ATB<1>, NAND gate ND4 for performing the NAND operation on signals AT<0> and AT<1>, and inverters INV1, INV2, INV3 and INV4 connected corresponding to the NAND gates ND1, ND2, ND3 and ND4, respectively. Herein, each of the inverters INV1, INV2, INV3 and INV4 inverts the phase of the output signal of a corresponding NAND gate, thereby outputting the output signals as signals "BAX01<0>," "BAX01<1>," "BAX01<2>" and "BAX01<3>."

The address decoder 120 according to an embodiment of the present invention can latch and output a decoded address using the decoder enable signal "XAENPB_SUM" until the next active command is input, so that it is possible to solve the problem of unnecessary current consumption due to toggle of an address signal, which occurs in the prior art.

Although the embodiment of the present invention is described with reference to the construction of the address decoder 120 decoding a two-bit address signal, the present invention is not limited thereby, but may be applied to various address decoders decoding a three or more bit address signal.

Figure 6:
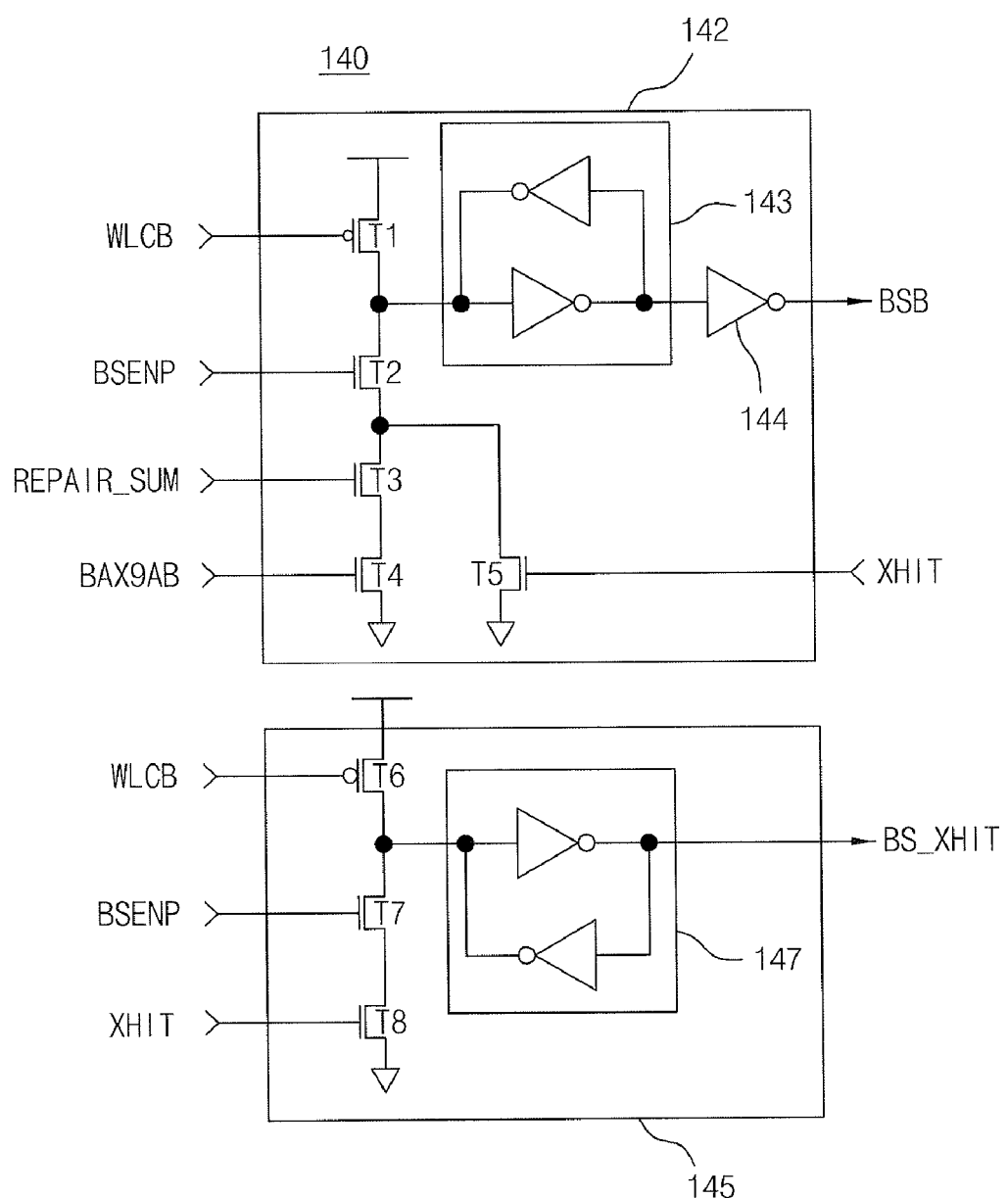
FIG. 6 is a circuit diagram illustrating the construction of the block selection unit of FIG. 4.

FIG. 6 is a circuit diagram illustrating the construction of the block selection unit of FIG. 4. As shown in FIG. 6, the block selection unit 140 includes a block selection signal generator 142 and a redundancy block selection signal generator 145.

The block selection signal generator 142 generates and outputs a block selection signal "BSB" in response to the word line clear signal "WLCB," block selection enable signal "BSENP," decoded block address signal "BAX9AB," redundancy signal "XHIT" and repair signal "REPAIR_SUMB."

In more detail, the block selection signal generator 142 includes first to fifth transistors T1 to T5. The first transistor T1 is turned on in response to the word line clear signal "WLCB" and outputs an applied power supply voltage through the output terminal of the first transistor T1. The second transistor T2 is connected to the output terminal of the first transistor T1 and is turned on in response to the block selection enable signal "BSENP. " The third transistor T3 is connected to the second transistor T2 and is turned on in response to the repair signal "REPAIR_SUMB." The fourth transistor T4 is connected to the third transistor T3, and is turned on in response to the decoded block address signal "BAX9AB" so as to be connected to a ground voltage. The fifth transistor T5 is connected to the second transistor T2, and is turned on in response to the redundancy signal "XHIT" so as to be connected to a ground voltage.

Preferably, the block selection signal generator 142 further includes a first latch unit 143 and an inverter 144. Herein, the first latch unit 143 is connected to the output terminal of the first transistor T1 so as to latch and output the output signal of the first transistor T1, and the inverter 144 inverts the phase of the output signal of the first latch unit 143 and outputs the inverted signal as the block selection signal "BSB."

Hereinafter, the operation of the block selection signal generator 142 will be described. When the word line clear signal "WLCB," block selection enable signal "BSENP," decoded block address signal "BAX9AB" and repair signal "REPAIR_SUMB" are all in a high state, the block selection signal generator 142 enables the block selection signal "BSB" to a low state. Also, when the word line clear signal "WLCB," block selection enable signal "BSENP" and redundancy signal "XHIT" are all in a high state, the block selection signal generator 142 shifts the block selection signal "BSB" into a low state. When both the word line clear signal "WLCB" and block selection enable signal "BSENP" are in a low state, the block selection signal generator 142 disables the block selection signal "BSB" to a high state.

The redundancy block selection signal generator 145 generates and outputs the redundancy block selection signal "BS_XHIT" in response to the word line clear signal "WLCB," block selection enable signal "BSENP" and redundancy signal "XHIT."

In more detail, the redundancy block selection signal generator 145 includes sixth to eighth transistors T6 to T8. The sixth transistor T6 is turned on in response to the word line clear signal "WLCB" and outputs an applied power supply voltage through the output terminal of the sixth transistor T6. The seventh transistor T7 is connected to the output terminal of the sixth transistor T6 and is turned on in response to the block selection enable signal "BSENP." The eighth transistor T8 is connected to the seventh transistor T7, and is turned on in response to the redundancy signal "XHIT" so as to be connected to a ground voltage.

Preferably, the redundancy block selection signal generator 145 further includes a second latch unit 147 connected to the output terminal of the sixth transistor T6 so as to latch and output the output signal of the sixth transistor T6.

Hereinafter, the operation of the redundancy block selection signal generator 145 will be described. When the word line clear signal "WLCB," block selection enable signal "BSENP" and redundancy signal "XHIT" are all in a high state, the redundancy block selection signal generator 145 enables the redundancy block selection signal "BS_XHIT" to a high state.

When both the word line clear signal "WLCB" and the block selection enable signal "BSENP" are in a low state, the redundancy block selection signal generator 145 disables the redundancy block selection signal "BS_XHIT" to a low state.

According to an embodiment of the present invention, the block selection unit 140 separately generates the block selection signal "BSB" and redundancy block selection signal "BS_XHIT." The block selection signal "BSB" and redundancy block selection signal "BS_XHIT" are used for the block control unit 150 to generate the main word line latch pulse "LAXP," sub-word line latch pulse "LAXP_ALL" and redundancy word line latch pulse "LAXP_RM."

Therefore, according to the present invention, the conventional word line enable control unit is unnecessary, and it is possible to use further organically generated signals in controlling the word line driver, as compared with the prior art.

Figure 7:
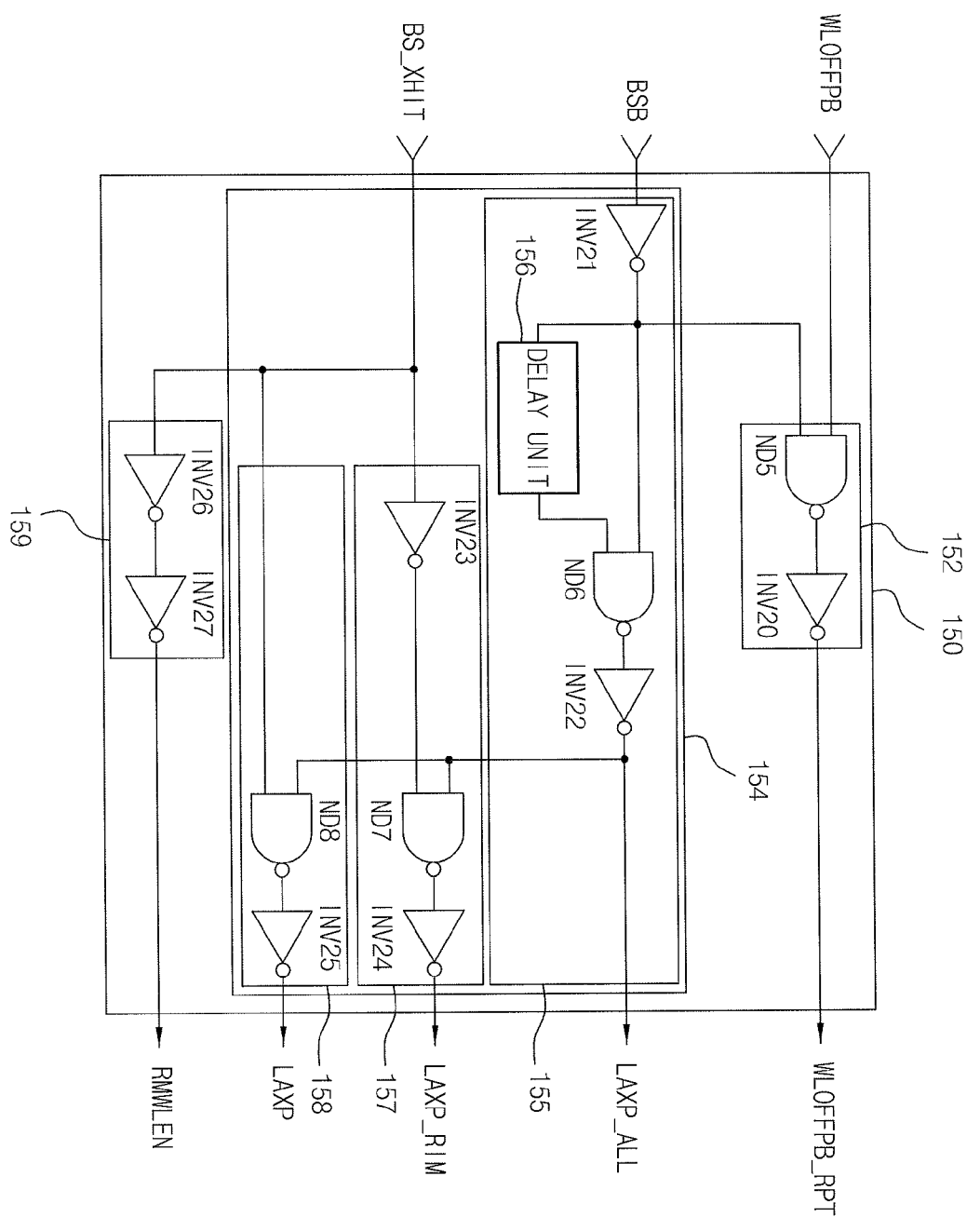
FIG. 7 is a circuit diagram illustrating the construction of the block control unit of FIG. 4.

FIG. 7 is a circuit diagram illustrating the construction of the block control unit of FIG. 4. As shown in FIG. 7, the block control unit 150 according to an embodiment of the present invention includes a word line off signal generator 152, a latch pulse generator 154 and a redundancy enable signal generator 159.

The word line off signal generator 152 is constructed to generate a word line off signal "WLOFFPB_RPT," which is enabled when the precharge pulse "WLOFFPB" and block selection signal "BSB" are both enabled. In more detail, the word line off signal generator 152 includes a NAND gate ND5 and an inverter INV20. The NAND gate ND5 performs the NAND operation on the precharge pulse "WLOFFPB" and a phase-inverted block selection signal "BSB," and the inverter INV20 inverts the phase of the precharge pulse "WLOFFPB" and outputs the inverted pulse as the word line off signal "WLOFFPB_RPT."

The latch pulse generator 154 is constructed to generate the sub-word line latch pulse "LAXP_ALL," main word line latch pulse "LAXP" and redundancy word line latch pulse "LAXP_RM" in response to the block selection signal "BSB" and redundancy block selection signal "BS_XHIT." In more detail, the latch pulse generator 154 includes a sub-word line latch pulse generator 155, a redundancy word line latch pulse generator 157 and a main word line latch pulse generator 158.

The sub-word line latch pulse generator 155 delays the edge of the block selection signal "BSB" and inverts the phase thereof, and outputs a resultant signal as the sub-word line latch pulse "LAXP_ALL." For example, the sub-word line latch pulse generator 155 may include an inverter INV21 for inverting the phase of the block selection signal "BSB," a delay unit 156 for delaying and outputting the output signal of the inverter INV21, a NAND gate ND6 for performing the NAND operation on the output signals of the inverter INV21 and delay unit 156, and an inverter INV22 for inverting the phase of the output signal of the NAND gate ND6 and outputting the inverted signal as the sub-word line latch pulse "LAXP_ALL."

The redundancy word line latch pulse generator 157 generates the redundancy word line latch pulse "LAXP_RM," which is enabled when the block selection signal "BSB" is enabled and the redundancy block selection signal "BS_XHIT" is disabled. For example, the redundancy word line latch pulse generator 157 may include an inverter INV23 for inverting the phase of the redundancy block selection signal "BS_XHIT," a NAND gate ND7 for performing the NAND operation on the sub-word line latch pulse "LAXP_ALL" and the output signal of the inverter INV23, and an inverter INV24 for inverting the phase of the output signal of the NAND gate ND7.

The main word line latch pulse generator 158 generates a main word line latch pulse "LAXP," which is enabled when the block selection signal "BSB" and redundancy block selection signal "BS_XHIT" are both enabled. For example, the main word line latch pulse generator 158 may include a NAND gate ND8 for performing the NAND operation on the sub-word line latch pulse "LAXP_ALL" and redundancy block selection signal "BS_XHIT," and an inverter INV25 for inverting the phase of the output signal of the NAND gate ND8.

The redundancy enable signal generator 159 generates a redundancy word line latch pulse "RMWLEN" by delaying the redundancy block selection signal "BS_XHIT." For example, the redundancy enable signal generator 159 may include an even number of inverters INV26 and INV27 to delay the redundancy block selection signal.

Figure 8:
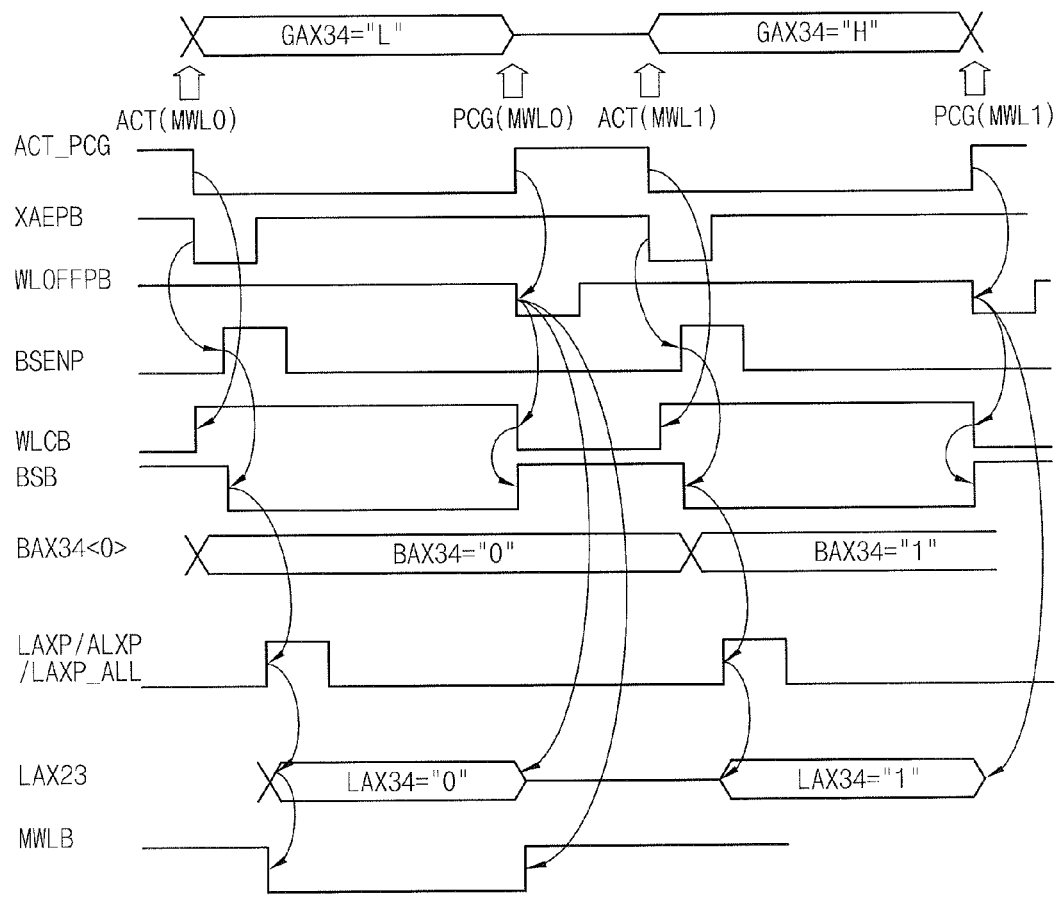
FIG. 8 is a timing view illustrating the operation of the row address controller of FIG. 4.

FIG. 8 is a timing view illustrating the operation of the row address controller of FIG. 4, in which a procedure of processing a row address "GAX34" is illustrated. As shown in FIG. 8, the row address controller according to an embodiment of the present invention generates a word line driving signal "MWLB" by using an active precharge signal "ACT_PCG," which has information about an external active command and an external precharge command.

First, the bank control unit 110 receives the active precharge signal "ACT_PCG" and generates the active pulse "XAEPB" and the precharge pulse "WLOFFPB." That is, the bank control unit 110 generates the active pulse "XAEPB" in synchronization with the falling edge of the active precharge signal "ACT_PCG," and generates the precharge pulse "WLOFFPB" in synchronization with the rising edge of the active precharge signal "ACT_PCG."

Also, the bank control unit 110 outputs the word line clear signal "WLCB," while shifting the word line clear signal "WLCB" into a high state in synchronization with the falling edge of the active precharge signal "ACT_PCG," and while shifting the word line clear signal "WLCB" into a low state in synchronization with the falling edge of the precharge pulse "WLOFFPB." Therefore, the word line clear signal "WLCB" is maintained in a high state from a time point when an active command is input to a time point when a precharge command is input. In addition, the bank control unit 110 generates the block selection enable signal "BSENP" by using the falling edge of the active pulse "XAEPB."

Next, the block selection unit 140 outputs the block selection signal "BSB," while shifting the block selection signal "BSB" into a low state when the word line clear signal "WLCB," block selection enable signal "BSENP," etc. are in a high state, and while shifting the block selection signal "BSB" into a high state when the word line clear signal "WLCB," block selection enable signal "BSENP," etc. are in a low state. That is, the falling edge of the block selection signal "BSB" is synchronized with the rising edge of the block selection enable signal "BSENP," and the rising edge of the block selection signal "BSB" is synchronized with the falling edge of the word line clear signal "WLCB."

The block control unit 150 generates the main word line latch pulse "LAXP" by using the falling edge of the block selection signal "BSB."

Meanwhile, the address decoder 120 latches a row address signal "GAX34" in response to the decoder enable signal "XAENPB_SUM," and then decodes and outputs the latched signal as a decoded address signal "BAX34<0>." Since the decoder enable signal "XAENPB_SUM" is synchronized with the falling edge of the active pulse "XAEPB," the decoded address signal "BAX34<0>" is latched in synchronization with the falling edge of the active pulse "XAEPB."

The first latch unit 160 latches the decoded address signal "BAX34<0>" by using the main word line latch pulse "LAXP" until the falling edge of the precharge pulse "WLOFFPB" is generated, and than outputs the latched signal as a latched address signal "LAX34."

The main word line driver 102 outputs the word line driving signal "MWLB" having a low state, which drives a word line corresponding to the latched address signal "LAX34" until the falling edge of the precharge pulse "WLOFFPB" is generated.

As described above, since the row address controller according to the present invention generates a row address control signal by means of a level signal having active and precharge information, it is possible to remove the delay unit used to delay an active command and the like in order to generate a row address control signal in the prior art.

Also, since the row address controller according to the present invention latches an address signal, which may be toggled, by means of the level signal having the active information until the next active command is input, and then outputs the address signal, it is possible to solve a problem of causing unnecessary current consumption in the decoder, which occurs due to the toggle of an address signal in the prior art.

In addition, since the row address controller according to the present invention separately generates a block selection signal and a redundancy block selection signal so as to select a block, an organic relation among row address control signals is maintained, thereby securing a stable operation.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A row address controller comprising:
    a bank control unit for generating an active pulse and a precharge pulse in response to an active precharge signal, and for generating a word line clear signal and a block selection enable signal by using the active pulse and precharge pulse;
    an address decoder for latching and decoding a row address signal in response to a decoder enable signal, and for outputting the decoded signal as a first address signal and a second address signal;
    a block selection unit for generating a block selection signal in response to a redundancy signal, a repair signal, the word line clear signal, the block selection signal and the first address signal;
    a block control unit for generating a word line latch signal in response to the precharge pulse and the block selection signal; and
    a latch unit for latching and outputting the second address signal in response to the word line latch signal.

2. The row address controller as claimed in claim 1, wherein the bank control unit receives an active precharge signal that includes information about a time point when an active command is input, information about a bank to be activated, and information about a time point when a precharge command is input.

3. The row address controller as claimed in claim 2, wherein the bank control unit receives an active pulse that includes the information about a bank to be activated, and includes the information about the input time point of the active command at an edge of the active pulse, at which a level state is shifted.

4. The row address controller as claimed in claim 3, wherein the bank control unit receives a precharge pulse that includes the information about the input time point of the precharge command at an edge of the precharge pulse, at which a level state is shifted.

5. The row address controller as claimed in claim 4, wherein the bank control unit generates a signal enabled from the input time point of the active command to the input time point of the precharge command, and outputs the generated signal as the word line clear signal.

6. The row address controller as claimed in claim 3, wherein the bank control unit delays and outputs the active pulse as the block selection enable signal.

7. The row address controller as claimed in claim 1, wherein the address decoder receives a decoder enable signal that is enabled when one of multiple banks is activated.

8. The row address controller as claimed in claim 7, wherein the address decoder comprises:
  a transmitter, which transmits a row address signal in response to the decoder enable signal;
  a latch for latching and outputting an output signal of the transmission means;
  an inverter for inverting a phase of the output signal of the transmission means and for outputting the inverted signal; and
  a decoder that decodes an output signal of the latch and an output signal of the inverter.

9. The row address controller as claimed in claim 8, wherein the transmitter comprises a transfer gate, which selectively transfers the row address signal in response to the decoder enable signal.

10. The row address controller as claimed in claim 8, wherein the latch comprises two inverters connected to each other in such a manner that an input terminal of each inverter is connected to an output terminal of a counterpart inverter.

11. The row address controller as claimed in claim 8, wherein the decoder comprises:
  a NAND gate for performing a NAND operation on the output signal of the latch and the output signal of the inverter; and
  an inverter for inverting a phase of an output signal of the NAND gate and for outputting the inverted signal.

12. The row address controller as claimed in claim 1, wherein the address decoder, latches and decodes a row address signal that includes a sub-word line address signal, a main word line address signal and a block address signal.

13. The row address controller as claimed in claim 12, wherein the address decoder outputs a first address signal, which corresponds to the block address signal, and the second address signal includes the main word line address signal and the sub-word line address signal.

14. The row address controller as claimed in claim 13, wherein the block selection unit generates a block selection signal that includes a first block selection signal and a second block selection signal, and wherein the block selection unit comprises:
  a block selection signal generator for generating the first block selection signal in response to the word line clear signal, the block selection enable signal, the first address signal, the redundancy signal and the repair signal; and
  a redundancy block selection signal generator for generating the second block selection signal in response to the word line clear signal, the block selection enable signal and the redundancy signal.

15. The row address controller as claimed in claim 14, wherein the block selection signal generator comprises:
  a first transistor which is turned on in response to the word line clear signal, and outputs a power supply voltage through an output terminal of the first transistor;
  a second transistor which is connected to the output terminal of the first transistor and is turned on in response to the block selection enable signal;
  a third transistor which is connected to the second transistor and is turned on in response to the repair signal;
  a fourth transistor which is connected to the third transistor and is turned on in response to the first address signal so as to be connected to a ground voltage; and
  a fifth transistor which is connected to the second transistor and is turned on in response to the redundancy signal so as to be connected to a ground voltage.

16. The row address controller as claimed in claim 15, wherein the block selection signal generator further comprises:
  a first latch module which is connected to the output terminal of the first transistor, and latches and outputs an output signal of the first transistor; and
  an inverter for inverting a phase of an output signal of the first latch module and for outputting the inverted signal.

17. The row address controller as claimed in claim 14, wherein the redundancy block selection signal generator comprises:
  a sixth transistor which is turned on in response to the word line clear signal, and outputs a power supply voltage through an output terminal of the sixth transistor;
  a seventh transistor which is connected to the output terminal of the sixth transistor and is turned on in response to the block selection enable signal; and
  an eighth transistor which is connected to the seventh transistor and is turned on in response to the redundancy signal so as to be connected to a ground voltage.

18. The row address controller as claimed in claim 17, wherein the redundancy block selection signal generator further comprises a second latch module connected to the output terminal of the sixth transistor, in which second latch module latches and outputs an output signal of the sixth transistor.

19. The row address controller as claimed in claim 14, wherein the block control unit comprises:
  a word line off signal generator that generates a word line off signal, which is enabled when the precharge pulse and the first block selection signal are enabled;
  a latch pulse generator that generates a first word line latch pulse, a second word line latch pulse and a third word line latch pulse in response to the first and second block selection signals; and
  a redundancy enable signal generator that generates a redundancy word line latch pulse by delaying the second block selection signal.

20. The row address controller as claimed in claim 19, wherein the word line off signal generator comprises:
  a first NAND gate for performing a NAND operation on the precharge pulse and a phase-inverted signal of the first block selection signal; and
  an inverter for inverting a phase of an output signal of the first NAND gate, and for outputting the inverted signal as the word line off signal.

21. The row address controller as claimed in claim 19, wherein the latch pulse generator comprises:
- a first word line latch pulse generator that delays an edge of the second block selection signal, inverting a phase of the second block selection signal, and outputting a resultant signal as the first word line latch pulse;
- a second word line latch pulse generator that generates the second word line latch pulse, which is enabled when the first block selection signal is enabled and the second block selection signal is disabled; and
- a third word line latch pulse generator for the third word line latch pulse, which is enabled when the first and block selection signals are enabled.

22. The row address controller as claimed in claim 21, wherein the first word line latch pulse generator comprises:
- a second inverter for inverting a phase of the second block selection signal;
- a delay unit for delaying an output signal of the second inverter, and then outputting the output signal of the second inverter;
- a second NAND gate for performing a NAND operation on the output signal of the second inverter and an output signal of the delay unit; and
- a third inverter for inverting a phase of an output signal of the second NAND gate, and for outputting the inverted signal as the first word line latch pulse.

23. The row address controller as claimed in claim 21, wherein the second word line latch pulse generator comprises:
- a fourth inverter for inverting a phase of the second block selection signal;
- a third NAND gate for performing a NAND operation on the first word line latch pulse and an output signal of the fourth inverter; and
- a fifth inverter for inverting a phase of an output signal of the third NAND gate.

24. The row address controller as claimed in claim 21, wherein the third word line latch pulse generator comprises:
- a fourth NAND gate for performing a NAND operation on the first word line latch pulse and the second block selection signal; and
- a sixth inverter for inverting a phase of an output signal of the fourth NAND gate.

25. The row address controller as claimed in claim 19, wherein the redundancy enable signal generator comprises an even number of inverters for delaying the second block selection signal.

26. The row address controller as claimed in claim 19, wherein the latch unit comprises:
- a first latch module that latches the main word line address signal using the first word line latch pulse until the word line off signal is enabled, and then outputting the main word line address signal;
- a second latch module that latches the sub-word line address signal using the second word line latch pulse, and then outputting the sub-word line address signal; and
- a redundancy word line enable module that latches the redundancy word line enable signal using the third word line latch pulse, and then outputting the redundancy word line enable signal.

27. The row address controller as claimed in claim 20, further comprising:
- a main word line driver for outputting a main word line driving signal in response to an output signal of the first latch module and the word line off signal;
- a sub-word line driver for outputting a sub-word line driving signal in response to an output signal of the second latch module and the word line off signal; and
- a redundancy word line driver for outputting a redundancy word line driving signal in response to an output signal of the redundancy word line enable module and the word line off signal.

* * * * *